United States Patent
Choi

(10) Patent No.: US 6,294,630 B1
(45) Date of Patent: Sep. 25, 2001

(54) POLYMERS HAVING DIALKYL MALONATE GROUPS AND RESIST COMPOSITIONS CONTAINING THE SAME FOR USE IN CHEMICALLY AMPLIFIED RESISTS

(75) Inventor: Sang-jun Choi, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/372,016

(22) Filed: Aug. 11, 1999

(30) Foreign Application Priority Data

Oct. 29, 1998  (KR) .................................. 98-45737

(51) Int. Cl.$^7$ ........................ C08F 8/12; C08F 220/28; C08L 33/00
(52) U.S. Cl. ........................ 526/313; 525/330.6
(58) Field of Search .................. 526/313; 525/330.6

(56) References Cited

U.S. PATENT DOCUMENTS 6,045,970 * 4/2000 Choi ................................. 526/323.1
6,114,422 * 9/2000 Choi ..................................... 524/247

* cited by examiner

Primary Examiner—Donald R. Wilson
(74) Attorney, Agent, or Firm—Myers Bigel Sibley & Sajovec, P.A.

(57) ABSTRACT

A polymer used in a chemically amplified resist is represented by the following formula:

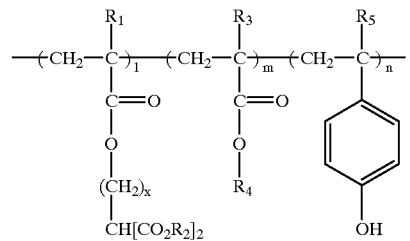

wherein $R_1$, $R_3$ and $R_5$ are each independently selected from the group consisting of —H, and —CH$_3$; $R_2$ is selected from the group consisting of t-butyl, tetrahydropyranyl, and 1-alkoxyethyl; $R_4$ is selected from the group consisting of —H, —CH$_3$, t-butyl, tetrahydropyranyl, and 1-alkoxyethyl; x is an integer ranging from 1 to 4; and wherein l, m, and n are selected such that $l/(l+m+n)$ ranges from 0.1 to 0.5, $m/(l+m+n)$ ranges from 0.01 to 0.5, and $(l+m)/(l+m+n)$ ranges from 0.1 to 0.7.

5 Claims, No Drawings

POLYMERS HAVING DIALKYL MALONATE GROUPS AND RESIST COMPOSITIONS CONTAINING THE SAME FOR USE IN CHEMICALLY AMPLIFIED RESISTS

FIELD OF THE INVENTION

The present invention generally relates to polymers, and compositions containing the same used in chemically amplified resists.

BACKGROUND OF THE INVENTION

With the increased integration of semiconductor chips, it may be desirable to fabricate a resist capable of forming chips with finer patterns. Thus, it may be necessary to use deep-ultraviolet rays (248 nm) with a shorter wavelength than conventional g-line (436 nm) and i-line (365 nm) rays in order to form resists with these finer patterns.

Conventional chemically amplified resists typically comprise base resins having tert-butoxy carbonyl (t-BOC) pendant groups. In these resins, acidolysis usually occurs readily via an acid catalyst. However, the resins may be undesirable since they often have lower decomposition temperatures as compared to their glass transition temperatures. Thus, a potentially undesirable T-top profile of a pattern may develop in lithography. Accordingly, the resin may become increasingly sensitive to environmental contamination.

SUMMARY OF THE INVENTION

In view of the above, it is an object of the present invention to provide polymers which are effectively acidolyzed in the presence of an acid catalyst to potentially exhibit an increased change in polarity.

It is another object of the present invention to provide resist compositions which allow for the formation of high resolution patterns believed to be attributable to a difference in solubility before and after exposure.

It is another object of the invention to provide resist compositions having potentially excellent thermal properties.

These and other objects and advantages are provided by the present invention. In one aspect, the invention relates to polymers used in chemically amplified resists. The polymers are represented by the formula (I):

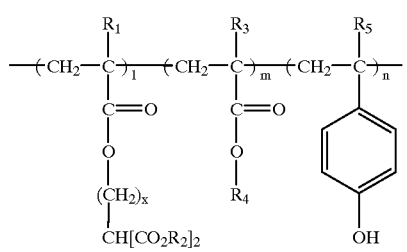

(I)

wherein $R_1$, $R_3$ and $R_5$ are each independently selected from the group consisting of —H, and —$CH_3$; $R_2$ is selected from the group consisting of t-butyl, tetrahydropyranyl, and 1-alkoxyethyl; $R_4$ is selected from the group consisting of —H, —$CH_3$, t-butyl, tetrahydropyranyl, and 1-alkoxyethyl; x is an integer of 1 to 4, $l/(l+m+n)$ ranges from 0.1 to 0.5, $m/(l+m+n)$ ranges from 0.01 to 0.5, and $(l+m)/(l+m+n)$ ranges from 0.1 to 0.7.

In another aspect, the invention relates to resist compositions. The resist compositions comprise the polymers described by formula (I) and photoacid generators.

The polymers and the resist compositions of the invention are potentially highly advantageous. In particular, because of a potentially large difference in solubility of the resist compositions to developing solutions between before and after exposure, the contrast of the resists is typically excellent. Additionally, due to potentially high decomposition temperatures, the thermal properties of the resist may be highly desirable.

DETAILED DESCRIPTION OF PREFERRED EMBODIMENTS

The invention will now be described in greater detail with reference to the preferred embodiments and examples set forth herein. It should be emphasized that these embodiments are only intended to illustrate the invention, and do not limit the scope of the invention as defined by the claims.

In one aspect, the invention relates to polymers represented by the formula (I):

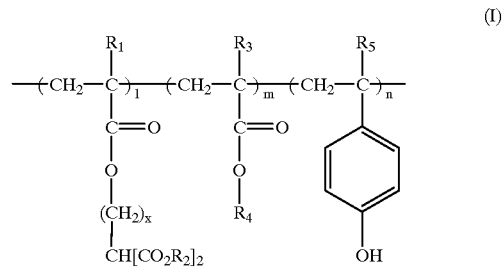

(I)

wherein $R_1$, $R_3$ and $R_5$ are each independently selected from the group consisting of —H, and —$CH_3$; $R_2$ is selected from the group consisting of t-butyl, tetrahydropyranyl, and 1-alkoxyethyl; $R_4$ is selected from the group consisting of —H, —$CH_3$, t-butyl, tetrahydropyranyl, and 1-alkoxyethyl; x is an integer ranging from 1 to 4, $l/(l+m+n)$ ranges from 0.1 to 0.5, $m/(l+m+n)$ ranges from 0.01 to 0.5, and $(l+m)/(l+m+n)$ ranges from 0.1 to 0.7.

In one embodiment, the polymer has a weight-average molecular weight of about 5,000 to about 100,000.

In another embodiment, $R_1$, $R_3$ and $R_5$ are each —H; $R_2$ is t-butyl; and $R_4$ is —H.

In another embodiment, $R_1$, $R_3$ and $R_5$ are each —H; and $R_2$ and $R_4$ are each t-butyl.

In another embodiment, $R_1$, $R_3$ and $R_5$ are each —H; and $R_2$ and $R_4$ are each 1-ethoxyethyl.

In another aspect, the invention relates to resist compositions. The resist compositions comprise the polymers described by formula (I) and photoacid generators.

The photoacid generators may be used in various amounts. Preferably, the resist compositions comprise from about 1 to about 15 percent by weight of the photoacid generators based on the weight of the polymers.

Various materials may be used as photoacid generators, the selection of which are known by those who are skilled in the art. Preferably, the photoacid generators are selected from the group consisting of triarylsulfonium salts, diaryliodonium salts, sulfonates, and mixtures thereof. More preferably, the photoacid generators are selected from the group consisting of triphenylsulfonium triflate, N-hydroxy succine imide triflate, and mixtures thereof.

In one embodiment, the resist compositions may comprise organic bases. The selection of the organic bases are known to one skilled in the art. Preferably, the organic bases are selected from the group consisting of triethyl amine, triisobutyl amine, diethanol amine, triethanol amine and mixtures thereof.

If employed, the organic bases may be used in various amounts. Preferably, the resist compositions comprise from about 0.01 to about 2.0 percent by weight of the organic bases on the basis of the weight of the polymers.

The following examples are provided to illustrate the invention, and are not intended to limit the invention as defined by the claims.

EXAMPLE 1

Synthesis of di-t-butylmalonylpropyl acrylate (DBMPA)

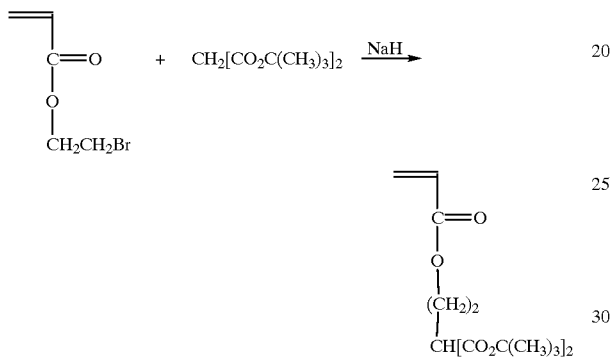

4.8 g (0.12 mol) of sodium hydride was dissolved in 250 ml of tetrahydrofuran (THF) and then 25 g (0.11 mol) of di-t-butyl malonate was slowly added dropwise. The solution was reacted at room temperature for 1 hour.

Thereafter, 18 g (0.1 mol) of 2-bromoethyl acrylate was slowly added dropwise to the obtained solution having a temperature of 0° C. The mixture was thereafter reacted at room temperature for 12 hours.

After the reaction is completed, excess THF is evaporated and the remainder was added dropwise to excess water. Thereafter, the reactant was neutralized using HCl and extracted using diethyl ether.

The obtained extracted product was dried using magnesium sulfate ($MgSO_4$) and the product was recovered using vacuum distillation and was found to have a yield of 60 percent.

EXAMPLE 2

Synthesis of poly (DBMPA-co-AA)

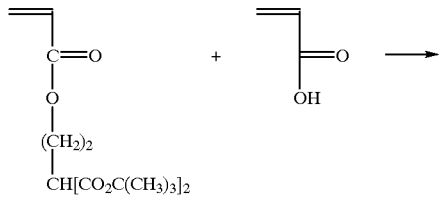

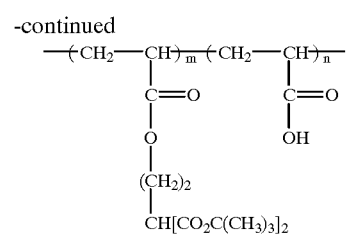

6.3 g (20 mmol) of DBMPA and 0.72 g (10 mmol) of acrylic acid (AA) were dissolved in 40 ml of anhydride THF together with 0.4 g of azobisisobutyronitrile (AIBN). The mixture was then purged using nitrogen for 1 hour and polymerized at 70° C. for 24 hours.

After polymerization, the obtained product was precipitated in excess (ten-fold) n-hexane. The precipitate was thereafter filtered with a glass filter, and then the obtained extractive was dissolved again in THF to then be reprecipitated in n-hexane.

After the precipitate was filtered, the resultant material was dried in a vacuum oven maintained at 50° C. for 24 hours. The product was then recovered and had a yield of 70 percent.

The weight-average molecular weight of the obtained product was determined to be 13,500 and the polydispersity thereof was determined to be 2.2.

EXAMPLE 3

Synthesis of poly (DBMPA-co-AST)

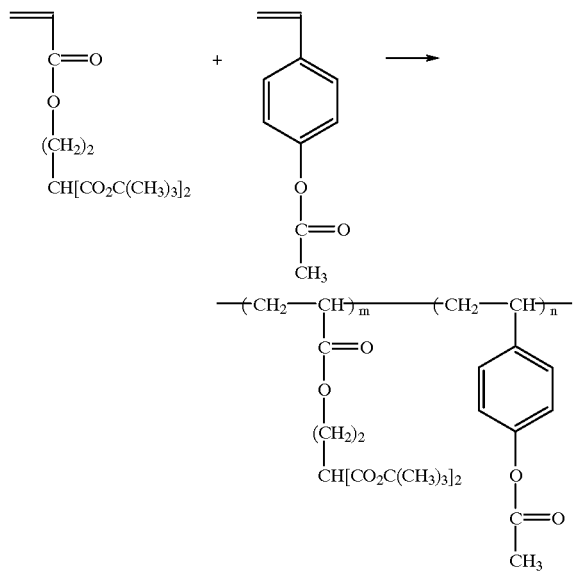

2.8 g (9 mmol) of DBMPA and 4.5 g (27 mmol) of acetoxy styrene (AST) were dissolved in 35 ml of toluene together with 0.35 g of azobisisobutyronitrile (AIBN). The resulting mixture was then purged using nitrogen for 1 hour and polymerized at 70° C. for 24 hours.

After polymerization, the obtained product was precipitated in an excess (ten-fold) of n-hexane and dried in a vacuum oven maintained at 50° C. for 24 hours. The product was thereafter recovered and had a yield of 70 percent.

The weight-average molecular weight of the obtained product was determined to be 12,500 and the polydispersity thereof was determined to be 1.87.

EXAMPLE 4

Synthesis of poly (DBMPA-co-HST)

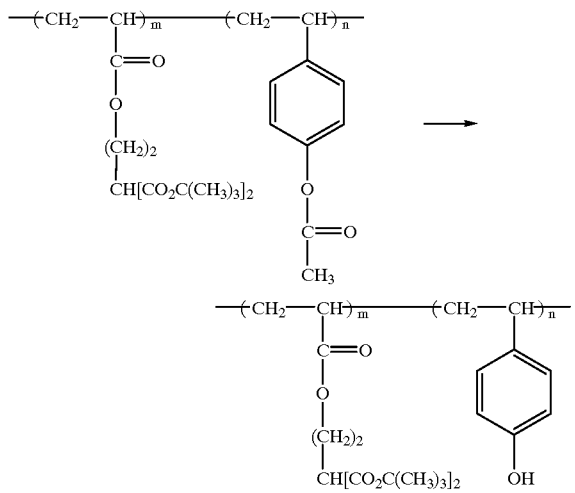

10 g of poly (DBMPA-co-AST) was reacted in a mixed solution of 28 percent (10 ml) ammonium hydroxide (NH$_4$OH) and 50 ml of methanol for 4 hours under reflux conditions. The obtained product was thereafter slowly precipitated in an excess water and was then neutralized using HCl.

The precipitate was then filtered with a glass filter and the filtered product was dissolved again in THF and reprecipitated in excess n-hexane. The precipitate was thereafter dried in a vacuum oven maintained at 50° C. for 24 hours. The product was then recovered and had a yield of 90 percent.

The weight-average molecular weight of the obtained product was determined to be 11,300 and the polydispersity thereof was determined to be 1.86.

EXAMPLE 5

Synthesis of terpolymer (DBMPA-BA-AST)

6.3 g (20 mmol) of DBMPA, 2.6 g (20 mmol) of t-butyl acrylate (BA) and 10 g (60 mmol) of acetoxy styrene (AST) were dissolved in 80 ml of toluene. 0.66 g of azobisisobutyronitrile (AIBN) was added to the mixture, and the mixture was purged using nitrogen for 1 hour. The mixture was then polymerized at 70° C. for 24 hours.

After polymerization, the obtained product was precipitated in an excess (ten-fold) of n-hexane and dried in a vacuum oven maintained at 50° C. for 24 hours. The product was then recovered and had a yield of 70 percent.

The weight-average molecular weight of the obtained product was determined to be 13,100 and the polydispersity thereof was determined to be 1.92.

EXAMPLE 6

Synthesis of terpolymer (DBMPA-BA-HST)

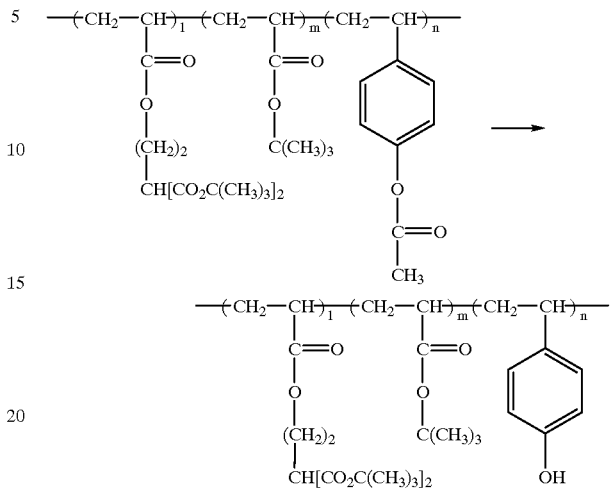

A terpolymer was synthesized by hydrolyzing an acetyl group of the terpolymer synthesized in Example 5 in the same manner as described in Example 4 to prepare a terpolymer. The terpolymer had a yield of 91 percent.

The weight-average molecular weight of the obtained product was determined to be 12,200 and the polydispersity thereof was determined to be 1.95.

EXAMPLE 7

Synthesis of Terpolymer (DBMPA-BMA-HST)

A reaction was carried out in the same manner as in Examples 5 and 6 using 9.4 g (30 mmol) of DBMPA, 1.4 g (10 mmol) of t-butyl metacrylate (BMA) and 10 g (60 mmol) of acetoxy styrene (AST) to prepare a terpolymer.

The weight-average molecular weight of the obtained product was determined to be 12,700. The polydispersity thereof was determined to be 1.86, and the transmittance was determined to be 73 percent/$\mu$m.

EXAMPLE 8

Resist Composition (A)

1.0 g of poly (DBMPA-co-HST) [m/(m+n)=0.25 and having weight-average molecular weight of 11,500] synthesized in Example 3 and 0.03 g of triphenyl sulfonium triflate as a photoacid generator (PAG) were completely dissolved in 6.0 g of propylene glycol monomethylether acetate (PGMEA). Thereafter, the obtained solution was filtered with a 0.2 $\mu$m membrane filter to obtain a resist composition. Then, the resist composition was coated to a thickness of about 0.5 $\mu$m on a silicon wafer treated with hexamethyldisilazane (HMDS).

The wafer coated with the resist composition was softbaked at 130° C. for 90 seconds and exposed using a KrF excimer laser with a numerical aperture (NA) of 0.45, and then post-exposure baking (PEB) was carried out at 140° C. for 90 seconds.

Thereafter, the resultant coated wafer was developed with 2.38 weight percent of tetramethylammonium hydroxide (TMAH) solution for 60 seconds. As a result, it was observed that clean 0.30 μm line-and-space patterns were obtained using an exposure dose of about 18 mJ/cm².

EXAMPLE 9

Resist Composition (B)

1.0 g of poly (DBMPA-co-HST) [m/(m+n)=0.25 and having weight-average molecular weight of 12,500] synthesized in Example 4 and 0.03 g of triphenyl sulfonium triflate as a photoacid generator (PAG) were dissolved in 6.0 g of propylene glycol monomethylether acetate (PGMEA). 3 mg of triethanolamine as an organic base was added thereto and was completely dissolved in the mixture. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 130° C. for 90 seconds and exposed using a KrF excimer laser with a numerical aperture (NA) of 0.45. The coated wafer then post-exposure baked (PEB) at 140° C. for 90 seconds.

Thereafter, the resultant wafer was developed with 2.38 weight percent of tetramethylammonium hydroxide (TMAH) solution for 60 seconds. As a result, it was observed that clean 0.30 μm line-and-space patterns were obtained using an exposure dose of about 26 mJ/cm².

EXAMPLE 10

Resist Composition (C)

1.0 g of poly(DBMPA-BA-HST) [l/(l+m+n)=0.2, m/(l+m+n)=0.2 and having a weight-average molecular weight of 12,500] synthesized in Example 6, and 0.03 g of triphenyl sulfonium triflate as a PAG were dissolved in 6.0 g of propylene glycol monomethylether acetate (PGMEA). 3 mg of triethanolamine as an organic base was added thereto and was completely dissolved in the mixture. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 130° C. for 90 seconds and exposed using a KrF excimer laser with a numerical aperture (NA) of 0.45. The post-exposure baking (PEB) was carried out at 140° C. for 90 seconds.

Thereafter, the resultant wafer was developed with 2.38 weight percent of tetramethylammonium hydroxide (TMAH) solution for 60 seconds. As a result, it was observed that clean 0.40 μm line-and-space patterns were obtained using an exposure dose of about 30 mJ/cm².

EXAMPLE 11

Resist Composition (D)

1.0 g of the poly(DBMPA-BMA-HST) [DBMPA:BMA:HST=30:10:60, and having a weight average molecular weight of 12,700] synthesized in Example 7 and 0.03 g of triphenyl sulfonium triflate as a PAG were dissolved in 6.0 g of propylene glycol monomethylether acetate (PGMEA). 3 mg of triethanolamine as an organic base was added thereto and was completely dissolved therein. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 130° C. for 90 seconds and exposed using a KrF excimer laser with a numerical aperture (NA) of 0.45. The coated wafer was then post-exposure baked (PEB) at 140° C. for 90 seconds.

Thereafter, the resultant wafer was developed with 2.38 weight percent of tetramethylammonium hydroxide (TMAH) solution for 60 seconds. As a result, it was observed that clean 0.40 μm line-and-space patterns were obtained using an exposure dose of about 33 mJ/cm².

Since the base resin constituting the resist composition according to the present invention contains dialkyl malonate as its pendant group, the base resin may be acidolyzed into a malonic acid by an acid generated by light in the presence of a photoacid generator (PAG). Thereby, the overall polymer solubility is believed to increase.

Although the present invention has been described in detail by way of preferred embodiments and examples, the invention is not limited thereto, and numerous modifications and variations may be practiced by one skilled in the art within the spirit and scope of the invention.

What is claimed is:

1. A polymer used in a chemically amplified resist and represented by the following formula:

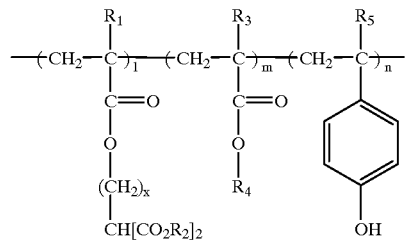

wherein $R_1$, $R_3$ and $R_5$ are each independently selected from the group consisting of —H and —CH$_3$; $R_2$ is selected from the group consisting of t-butyl, tetrahydropyranyl and 1-alkoxyethyl; $R_4$ is selected from the group consisting of —H, —CH$_3$, t-butyl, tetrahydropyranyl and 1-alkoxyethyl; x is an integer ranging from 1 to 4; and wherein l, m, and n are selected such that l/(l+m+n) ranges from 0.1 to 0.5, m/(l+m+n) ranges from 0.01 to 0.5, and (l+m)/(l+m+n) ranges from 0.1 to 0.7.

2. The polymer according to claim 1, wherein the polymer has a weight-average molecular weight ranging from about 5,000 to about 100,000.

3. The polymer according to claim 1, wherein $R_1$, $R_3$ and $R_5$ are each —H, $R_2$ is t-butyl and $R_4$ is —H.

4. The polymer according to claim 1, wherein $R_1$, $R_3$ and $R_5$ are each —H, and $R_2$ and $R_4$ are each t-butyl.

5. The polymer according to claim 1, wherein $R_1$, $R_3$ and $R_5$ are each —H, and $R_2$ and $R_4$ are each 1-ethoxyethyl.

* * * * *